(12) United States Patent
Callahan

(10) Patent No.: US 6,181,172 B1
(45) Date of Patent: Jan. 30, 2001

(54) HIGH VOLTAGE DETECT CIRCUIT WITH INCREASED LONG TERM RELIABILITY

(75) Inventor: John M. Callahan, San Ramon, CA (US)

(73) Assignee: Philips Electronics North America Corp., New York, NY (US)

(*) Notice: Under 35 U.S.C. 154(b), the term of this patent shall be extended for 522 days.

(21) Appl. No.: 08/579,490

(22) Filed: Dec. 27, 1995

(51) Int. Cl.[7] .................................................. H03L 7/00
(52) U.S. Cl. ........................ 327/143; 327/78; 327/205; 327/206; 327/437; 326/112
(58) Field of Search .............................. 327/77, 86, 78, 327/79, 80, 81, 143, 205, 206, 208, 437; 326/112, 121

(56) References Cited

U.S. PATENT DOCUMENTS

| | | | |
|---|---|---|---|
| 4,862,019 | * 8/1989 | Ashmore, Jr. ........................ | 327/77 |
| 5,118,968 | * 6/1992 | Douglas et al. ..................... | 327/78 |
| 5,510,735 | * 4/1996 | Mahabadi ............................ | 327/80 |

* cited by examiner

Primary Examiner—Dinh T. Le
(74) Attorney, Agent, or Firm—Patrick T. King

(57) ABSTRACT

A voltage detector circuit discriminates between a 13 volt Programming signal and a 6 volt signal without creating a field across the gate oxide of a sensing transistor in excess of 7.0 MegaV/cm. A PMOS transistor has a source terminal and a substrate terminal connected, both connected to the input terminal, A gate terminal is connected to a VCC voltage level. A shunt NMOS transistor has a drain terminal connected to the drain terminal of the PMOS transistor and a source terminal connected to a ground terminal. A gate terminal of the shunt NMOS transistor is connected to the VCC voltage level. The NMOS transistor is turned on to provide a shunt resistance between the drain terminal of the PMOS transistor and ground. A drain terminal of a series NMOS transistor is connected to the drain terminal of the PMOS transistor. A gate terminal of the series NMOS transistor is connected to VCC. The source terminal of the series NMOS transistor is connected to a sensing output terminal. The gate to bulk voltage across the PMOS transistor does not exceed the input voltage minus VCC. A Schmitt trigger circuit is connected to the source terminal of the series NMOS transistor.

4 Claims, 2 Drawing Sheets

HIGH VOLTAGE DETECT CIRCUIT WITH INCREASED LONG TERM RELIABILITY

BACKGROUND OF THE INVENTION

1. Field of the Invention

This invention relates to integrated circuits and, more particularly, to techniques for reducing high voltage stress on the transistors of a high-voltage detector circuit which distinguishes, for example, between 13 volts and 6 volts.

2. Prior Art

Voltage stress on the gate oxide of an integrated-circuit transistor produces long-term degradation of the transistor. It has been found that an electric field in the range of 7 to 10 Megavolts per centimeter across a gate-oxide causes charge to be injected into the gate oxide. This injected charge causes long term degradation of the transistor, such as, for example, threshold voltage variations, variations in mobility, etc.

An example of a circuit in which the gate oxide of a transistor is stressed by high voltage is a detector circuit which is used to detect the presence of a 13 volt programming voltage used for programming an array of anti-fuse memory circuits. The detector circuit can have 13 volts across the gate oxide of a detector transistor. For a gate oxide thickness of 165 Angstroms and a voltage of 13 volts, an electric field of 7.88 MegaV/cm is generated between the top of the gate and the substrate of the transistor. An electric field of this magnitude is within the range where long-term degradation occurs.

FIG. 1 is a circuit diagram 100 of a prior art high voltage detection circuit 100 for detecting the presence of a 13 volt programming voltage or a 6 volt supply voltage. This circuit is designed to discriminate between a 13 volt signal or a 6 volt signal provided at an input terminal 102. The input terminal 102 is connected to the drain and source terminals of NMOS transistor 104. A substrate terminal for NMOS transistor 104 is connected to a ground reference voltage. The source terminal of the transistor 104 is connected to the source and substrate terminals of a PMOS transistor 106. The gate terminal of the PMOS transistor 106 is connected to VCC and to the gate terminal and the drain terminal of another NMOS transistor 108. The source terminal of PMOS transistor 106 is connected to the source terminal of NMOS transistor 108. The drain terminal of the PMOS transistor 106 is connected to a drain terminal of a NMOS bleeder transistor 110 and to an output terminal 112. The source terminal of the NMOS bleeder transistor 110 is connected to a ground reference voltage. The gate terminal of the NMOS bleeder transistor 110 is connected to VCC. The NMOS bleeder transistor 110 provides a fixed resistance to ground for draining charge on the output terminal 112 to ground when 6 volts appears at the input terminal 102. In operation, a 13 volt signal on terminal 102 causes a logical high voltage to appear on output terminal 112. A 6 volt signal on terminal 102 causes a logical low voltage to appear on output terminal 112.

A problem with the voltage detection circuit 100 of FIG. 1 is that 13 volts can appear across the gate oxide of NMOS transistor 104 between the gate terminal and the substrate terminal. The thickness of the gate oxide of transistor 104 can range between 165 to 185 Angstroms. With 13 v and 165 Angstroms, the field across the gate oxide of transistor 104 is 7.88 MegaV/cm between the top of the gate and substrate. An electric field in the range of 7 to 10 MegaVolts per centimeter causes charges to be injected into the gate oxide resulting in a long term degradation of the transistor.

Consequently, a need exists for a voltage detector circuit which can discriminate between a 13 v programming voltage and a 6 v voltage without creating a field across the gate oxide of a sensing transistor in excess of 7.0 MegaV/cm.

SUMMARY OF THE INVENTION

It is therefore an object of the invention to provide a circuit which can discriminate between a 13 v programming voltage and a 6 v voltage without creating a field across the gate oxide of a sensing transistor in excess of 7.0 MegaV/cm.

In accordance with this and other objects of the invention, a voltage detector circuit is provided which can discriminate between a 13 v programming voltage and a 6 v voltage without creating a field across the gate oxide of a sensing transistor which is in excess of 7.0 MegaV/cm. An input terminal is provided with a two-level input signal. The first level of the input signal is a high voltage (13 volts) and the second level is a VCC or 6 v voltage level.

A PMOS transistor has a source terminal and a substrate terminal, both connected to the input terminal. The PMOS transistor has a gate terminal connected to the VCC voltage level, and the PMOS transistor has a drain terminal. The gate to bulk voltage across the PMOS transistor does not exceed the input voltage minus VCC.

A shunt NMOS transistor has a drain terminal connected to the drain terminal of the PMOS transistor and a source terminal connected to a ground terminal. A gate terminal of the shunt NMOS transistor is connected to the VCC voltage level. The NMOS transistor is turned on to provide a shunt resistance between the drain terminal of the PMOS transistor and ground.

A series NMOS transistor has a drain terminal connected to the drain terminal of the PMOS transistor and has a source terminal. A gate terminal of the series NMOS transistor is connected to VCC.

A Schmitt trigger circuit is connected to the source terminal of the series NMOS transistor to restore signal levels to full voltage levels.

A semiconductor circuit structure is provided which discriminates between a high voltage input signal and a lower voltage input signal without creating an excessive field across the gate oxide of a sensing transistor. The structure includes a p⁻ substrate and a n⁻ well formed in the p substrate. An n⁺ input-connection region is formed in the n⁻ well. A first p⁺ region and a second p⁺ region are both formed in the n⁻ well to define a PMOS transistor region or channel there between the two gate p⁺ regions. A gate oxide is formed adjacent to the channel and a gate contact is formed over the gate oxide layer. The gate contact is connected to a gate terminal. A detector input terminal is connected to the n⁺ input connection region and the first p⁺ source region. An output terminal connected to the second p⁺ region drain.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
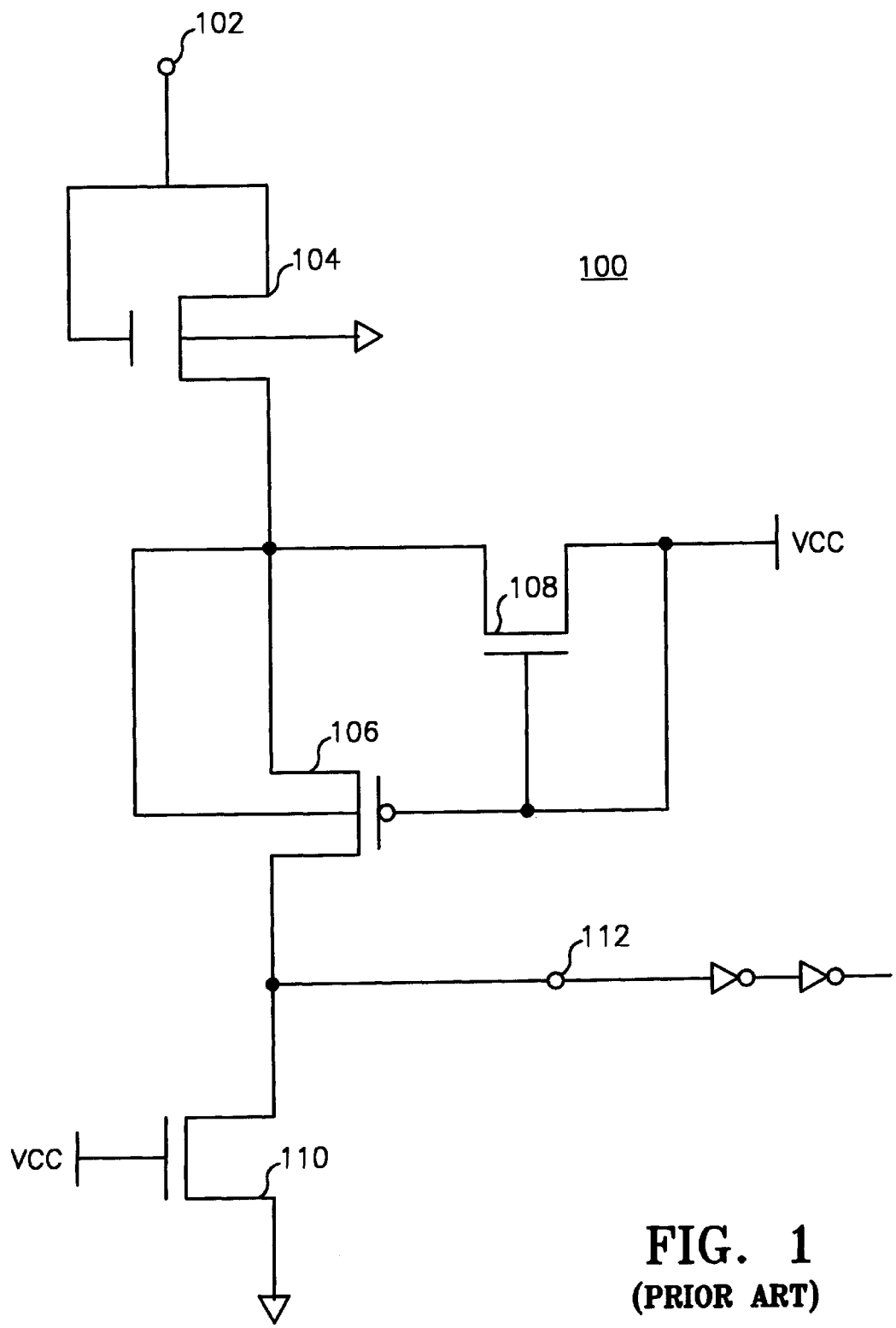
FIG. 1 is a circuit diagram of a prior art circuit for detecting the presence of a 13 volt programming voltage or a 6 volt supply voltage.
Figure 2:
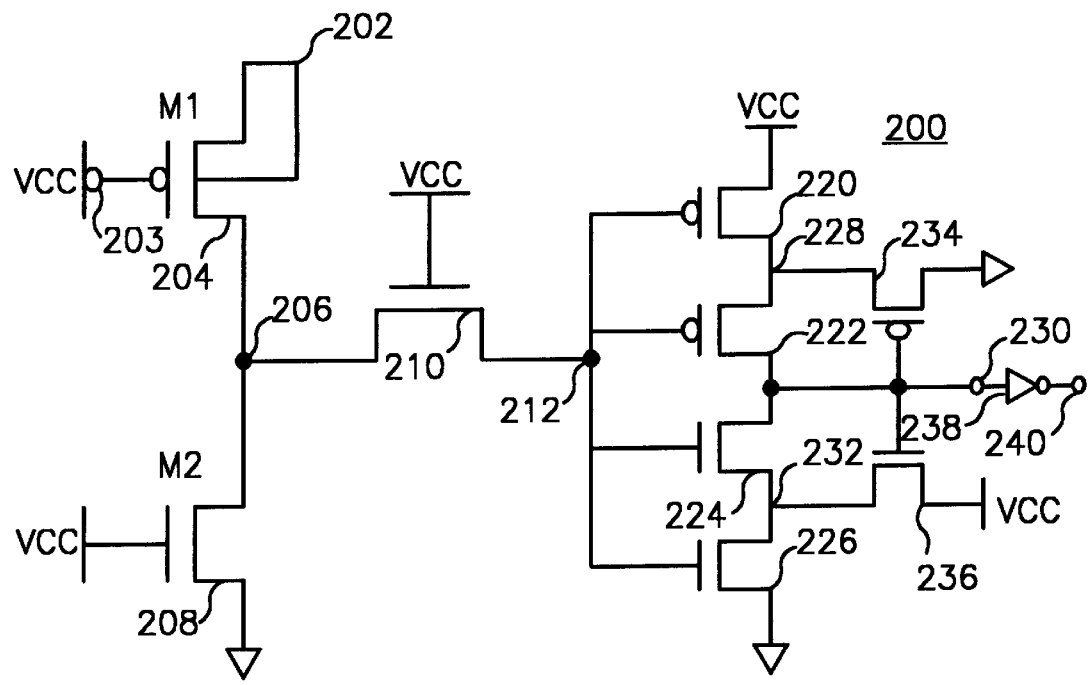
FIG. 2 is a circuit diagram of a sensing circuit for or detecting the presence of a 13 volt programming voltage or a 6 volt supply voltage where the maximum voltage stress imposed on a sensing transistor is 13 volt minus VCC.

FIG. 2 shows a circuit 200 for detecting the presence of a 13 volt high-voltage programming voltage or a 6 volt supply voltage at an input terminal 202. It will be seen that the maximum voltage stress imposed on a sensing transistor in this circuit is 13–6 volts.

The input terminal 202 of the circuit 200 is connected to the source and substrate terminals of a PMOS transistor 204. The gate terminal 203 of the PMOS transistor 204 is connected to VCC, which is usually 5 volts but which may be increased to 6 volts for a programming operation. A drain terminal of the PMOS transistor 204 is connected to a terminal 206 (TERMINAL 1). The drain terminal of the PMOS transistor 204 is connected to a drain terminal of a NMOS bleeder transistor 208. The source terminal of the NMOS bleeder transistor 208 is connected to a ground reference voltage. The gate terminal of the NMOS bleeder transistor 208 is connected to VCC. The NMOS bleeder transistor 208 provides a fixed resistance to ground for draining charge on the output terminal 206 to ground. In operation, a 13 volt signal on terminal 202 turns on the PMOS transistor 204 and provides a 13 volt signal on terminal 206. A 6 volt signal on terminal 202 turns off the PMOS transistor 204 and the bleeder transistor 208 pulls terminal 206 to ground.

A drain terminal of a series NMOS transistor 210 is connected to terminal 206. A gate terminal of the series transistor 210 is connected to VCC. The source terminal of the series transistor 210 is connected to a logic output terminal 212. The series transistor 210 is always on so that it provides a zero volt output signal or a 6 volt output signal at the logic output terminal 212, depending on the voltage level at terminal 206.

The logic output terminal 212 is connected to a CMOS Schmitt trigger circuit which restores the full voltage swings to a signal. The CMOS Schmitt trigger circuit includes four transistors 220, 222, 224, 226 connected in series. A first p-channel transistor 220, a second p-channel transistor 222, a first n-channel transistor 224, and a second n-channel transistor 226 all have their respective gate terminals connected to a common input terminal 212. The drain terminal of the p-channel transistor 220 is connected to the positive voltage source VCC. The source terminal of the p-channel transistor 220 is coupled to a terminal 228 and to the drain terminal of the n-channel transistor 222. The drain terminal of the p-channel transistor 222 is coupled to an output terminal 230. The drain terminal of the n-channel transistor 224 is also coupled to the output terminal 230. The source terminal of the first n-channel transistor 224 is coupled to the drain terminal of the second n-channel transistor 226 and to a terminal 232. The source terminal of the second n-channel transistor 226 is connected to the ground voltage source.

A p-channel feedback transistor 234 has its source terminal connected to the terminal 228 and its drain terminal connected to the ground voltage source. The gate terminal of the p-channel feedback transistor 234 is connected to the output terminal 230. An n-channel feedback transistor 236 has its source terminal connected to the terminal 232 and its drain terminal connected to the VCC. The gate terminal of the n-channel feedback transistor 236 is connected to the output terminal 230.

The output terminal 230 in connected to the input terminal of an inverter which ha s an output terminal at which is provided a logic level signal for controlling, for example, programming functions in an anti-fuse memory array.

In operation, the bleeder transistor 208 functions as a high resistance current drain. When the input terminal 202 receives an input signal of 6 volts or less, PMOS transistor 204 is off and terminal 206 and 212 drain to 0 volts which causes terminal 230 to go to VCC. The signal on terminal 212 is inverted in the Schmitt trigger circuit and the output signal of the Schmitt trigger circuit is inverted by the inverter 238.

When the input terminal 202 receives an input signal greater than 6 volts+one absolute PMOS threshold voltage, PMOS transistor 204 drain terminal is activated. The voltage required at the input terminal 202 to switch the circuit 200 is 7.4 to 8.2 volts. When the gate to source voltage of the PMOS transistor 204 exceeds a threshold value, PMOS transistor 204 turns on and passes the source voltage to terminal 206. Terminal 212 then goes to a voltage level equal to VCC minus the threshold voltage of the series NMOS transistor 210, which causes terminal 230 to drop to 0 volts.

Figure 3:
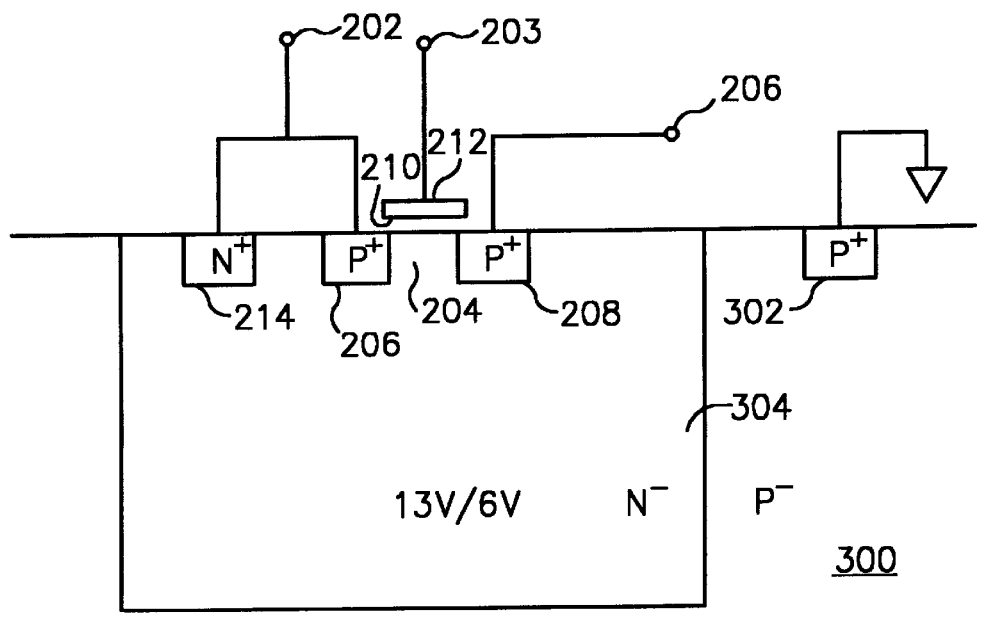
FIG. 3 is a cross sectional view of a semiconductor substrate which provides the sensing circuit of FIG. 2.

FIG. 3 shows a cross sectional view of a semiconductor substrate which provides the PMOS transistor 204 of FIG. 2. A p⁻ substrate 300 is doped to provide a p⁺ connection terminal 302 for connection of the substrate 300 to a ground voltage. An n⁻ well 304 is formed in the substrate 300. The PMOS transistor 204 is formed by forming a source p⁺ region 306 and a drain p⁺ region 308. A gate oxide region 310 is formed along the channel of transistor 204 and a gate contact layer 312 is formed over the gate oxide region 310. The gate contact layer 312 is connected to the gate terminal 203, which has VCC applied thereto. A n⁺ connection terminal 314 is formed into the n⁻ well 304 and is connected to the input terminal 202. The input signal to terminal 202 is either 13 volts or 6 volts.

FIG. 3 shows that the maximum voltage across the gate oxide layer 310 is 13 volts minus 6 volts, 7 volts, which works out to a field of 4.24 MegaV/cm. This circuit provide sufficient margin to meet a design goal here the transistors 204, 208 and 210 have no more than 7 v across their ate oxide layers. There are no high voltages in the Schmitt trigger circuit.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A voltage detector circuit which discriminates between a high voltage input signal and a lower input voltage without creating an excessive field across the gate oxide of a sensing transistor, comprising:

an input terminal to which is connected a two-level input signal where the input signal has a first voltage level which is a high voltage level greater than a VCC voltage level, and where the input signal has a second level which is a VCC voltage level;

a PMOS transistor having a source terminal and a substrate terminal, both connected to the input terminal, said PMOS transistor having a gate terminal connected to the VCC voltage level, and said PMOS transistor having a drain terminal;

a shunt NMOS transistor having a drain terminal connected to the drain terminal of the PMOS transistor, said NMOS transistor having a source terminal connected to a ground terminal, and said NMOS transistor having a gate terminal connected to the VCC voltage level, wherein the NMOS transistor is turned on to provide a shunt resistance between the drain terminal of the PMOS transistor and ground;

a series-pass NMOS transistor having a drain terminal connected to the drain terminal of the PMOS transistor, having a source terminal, and having a gate terminal always connected to a VCC voltage level, wherein the gate-to-bulk voltage across the PMOS transistor does not exceed 13 v-VCC.

2. The voltage detector circuit of claim 1 wherein first high voltage level is approximately 13 volts.

3. The voltage detector circuit of claim 1 wherein the VCC voltage level ranges between 5 and 6 volts.

4. The voltage detector circuit of claim 1 including a Schmitt trigger circuit having an input terminal connected to the source terminal of the series-pass NMOS transistor and having an output terminal.

* * * * *